United States Patent
Cheng et al.

(10) Patent No.: US 10,748,812 B1
(45) Date of Patent: Aug. 18, 2020

(54) AIR-GAP CONTAINING METAL INTERCONNECTS

(71) Applicant: International Business Machines Corporation, Armonk, NY (US)

(72) Inventors: Kenneth C. K. Cheng, Albany, NY (US); Koichi Motoyama, Clifton Park, NY (US); Kisik Choi, Watervliet, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/286,192

(22) Filed: Feb. 26, 2019

(51) Int. Cl.
*H01L 21/768* (2006.01)
*H01L 23/532* (2006.01)

(52) U.S. Cl.
CPC .... *H01L 21/7682* (2013.01); *H01L 21/76832* (2013.01); *H01L 21/76897* (2013.01); *H01L 23/5329* (2013.01); *H01L 23/53238* (2013.01); *H01L 23/53223* (2013.01); *H01L 2924/01013* (2013.01); *H01L 2924/01079* (2013.01)

(58) Field of Classification Search
CPC ..... H01L 2924/01029; H01L 21/76846; H01L 21/76843; H01L 23/53223; H01L 2924/01079; H01L 23/53228
USPC ........ 257/734, 751, 758; 438/619, 622, 627, 438/624
See application file for complete search history.

(56) References Cited

U.S. PATENT DOCUMENTS

| | | | |
|---|---|---|---|
| 4,030,967 A | 6/1977 | Ingrey et al. |
| 6,492,732 B2 | 12/2002 | Lee et al. |
| 7,037,994 B2 | 5/2006 | Sugita et al. |
| 7,084,479 B2 | 8/2006 | Chen et al. |
| 7,094,669 B2 | 8/2006 | Bu et al. |
| 7,244,549 B2 | 7/2007 | Iwasawa et al. |
| 7,256,127 B2 | 8/2007 | Gallagher et al. |
| 7,303,855 B2 | 12/2007 | Hatakeyama et al. |
| 7,358,025 B2 | 4/2008 | Hatakeyama |
| 7,737,028 B2 | 6/2010 | Wang et al. |

(Continued)

OTHER PUBLICATIONS

Vaeth et al., "Transition Metals for Selective Chemical Vapor Deposition of Parylene-Based Polymers," Chem. Mater., 2000, 12(5), pp. 1305-1313 (Apr. 2000).

(Continued)

*Primary Examiner* — Thinh T Nguyen
(74) *Attorney, Agent, or Firm* — Vazken Alexanian; Michael J. Chang, LLC

(57) ABSTRACT

Air-gap containing metal interconnects with selectively-deposited dielectric material are provided. In one aspect, a method of forming an interconnect structure with air-gaps includes: forming interconnect metal lines separated from a first dielectric by a liner and a barrier layer; depositing a capping layer and an inhibitor layer over the interconnect metal lines; patterning the capping layer, inhibitor layer and first dielectric to form the air-gaps between the interconnect metal lines; selectively depositing a second dielectric to form a bridge of the second dielectric over/pinching off the air-gaps, wherein the barrier layer inhibits deposition of the second dielectric along the sidewalls of the interconnect metal lines, and the inhibitor layer inhibits deposition of the second dielectric on top of the interconnect metal lines. An interconnect structure is also provided.

8 Claims, 5 Drawing Sheets

(56) References Cited

U.S. PATENT DOCUMENTS

| | | |
|---|---|---|
| 7,829,268 B2 * | 11/2010 | Liu et al. ............ H01L 21/7682 |
| | | 430/220 |
| 8,071,459 B2 | 12/2011 | Braeckelmann et al. |
| 8,203,212 B2 | 6/2012 | Anderson et al. |
| 8,986,921 B2 | 3/2015 | Edelstein et al. |
| 9,299,582 B2 | 3/2016 | Ingle et al. |
| 9,385,028 B2 | 7/2016 | Nemani et al. |
| 9,472,417 B2 | 10/2016 | Ingle et al. |
| 9,607,881 B2 | 3/2017 | Liu et al. |
| 2007/0218677 A1 | 9/2007 | Engelhardt et al. |

OTHER PUBLICATIONS

Meng et al., "Parylene Etching Techniques for Microfluidics and Biomems," 18th IEEE International Conference on Micro Electro Mechanical Systems, pp. 568-571, Feb. 2005.

Pearton et al., "Dry Etching of Electronic Oxides, Polymers, and Semiconductors," Plasma Process. Polym. 2005, 2, pp. 16-37 (published Dec. 2004).

Hashemi et al., "Self-Correcting Process for High Quality Patterning by Atomic Layer Deposition," ASC Nano, vol. 9, No. 9 pp. 8710-8717 (Jul. 2015).

Khan et al., "Etching of Silicon Carbide for Device Fabrication and through Via-Hole Formation," Journal of Electronic Materials, vol. 30, issue 3, pp. 212-219 (Mar. 2001).

* cited by examiner (follows from FIG. 3)

AIR-GAP CONTAINING METAL INTERCONNECTS

FIELD OF THE INVENTION

The present invention relates to metal interconnect technology, and more particularly, to air-gap containing metal interconnects and techniques for formation thereof by a selectively-deposited dielectric material.

BACKGROUND OF THE INVENTION

Parasitic capacitance between interconnect metal lines is one of the key contributors to integrated circuit signal delay. One technique to reduce parasitic capacitance is to replace conventional inter-metal dielectric materials with air (i.e., air gaps).

However, implementing air-gaps between metal lines in a multi-level interconnect design can present some notable challenges. For instance, conventional air-gap technologies require the use of "pinch off" methods to create air gaps between the metal lines. However, these pinch-off methods generally introduce unwanted materials onto the sidewalls of the metal lines, offsetting the capacitance benefit achieved by the air gaps.

Further, via misalignment (i.e., unlanded vias) on air-gap containing metal interconnects often leads to the air-gaps being exposed, allowing metal to fill in the air-gaps and short the circuit. This via misalignment issue results in a narrow process window, making air-gap technology economically unviable.

Therefore, improved techniques for forming air-gap containing metal interconnects would be desirable.

SUMMARY OF THE INVENTION

The present invention provides air-gap containing metal interconnects and techniques for formation thereof by selectively-deposited dielectric material. In one aspect of the invention, a method of forming an interconnect structure with air-gaps is provided. The method includes: forming interconnect metal lines embedded in a first dielectric with the interconnect metal lines separated from the first dielectric by a liner and a barrier layer; depositing a capping layer onto the first dielectric over the interconnect metal lines; depositing an inhibitor layer over the capping layer; patterning the capping layer, the inhibitor layer and the first dielectric, wherein the patterning includes removing the first dielectric from between the interconnect metal lines to form the air-gaps between the interconnect metal lines and exposing the barrier layer along sidewalls of the interconnect metal lines; selectively depositing a second dielectric onto exposed surfaces of the capping layer at openings to the air-gaps to form a bridge of the second dielectric over and pinching off the air-gaps, wherein the barrier layer inhibits deposition of the second dielectric along the sidewalls of the interconnect metal lines, and wherein the inhibitor layer inhibits deposition of the second dielectric on top of the interconnect metal lines; and removing the inhibitor layer.

In another aspect of the invention, another method of forming an interconnect structure with air-gaps is provided. The method includes: forming interconnect metal lines embedded in a first dielectric with the interconnect metal lines separated from the first dielectric by a liner and a barrier layer; depositing a capping layer onto the first dielectric over the interconnect metal lines; patterning the capping layer and the first dielectric, wherein the patterning includes removing the first dielectric from between the interconnect metal lines to form the air-gaps between the interconnect metal lines and exposing the barrier layer along sidewalls of the interconnect metal lines; and depositing a second dielectric onto exposed surfaces of the capping layer at openings to the air-gaps to form a bridge of the second dielectric over and pinching off the air-gaps, wherein the barrier layer inhibits deposition of the second dielectric along the sidewalls of the interconnect metal lines.

In yet another aspect of the invention, an interconnect structure is provided. The interconnect structure includes: interconnect metal lines embedded in a first dielectric with the interconnect metal lines separated from the first dielectric by a liner and a barrier layer; a capping layer disposed on the first dielectric over the interconnect metal lines; air-gaps between the interconnect metal lines with the barrier layer present along sidewalls of the interconnect metal lines in the air-gaps; and a second dielectric disposed at openings to the air-gaps to form a bridge of the second dielectric over and pinching off the air-gaps.

A more complete understanding of the present invention, as well as further features and advantages of the present invention, will be obtained by reference to the following detailed description and drawings.

DETAILED DESCRIPTION OF PREFERRED EMBODIMENTS

Figure 1:
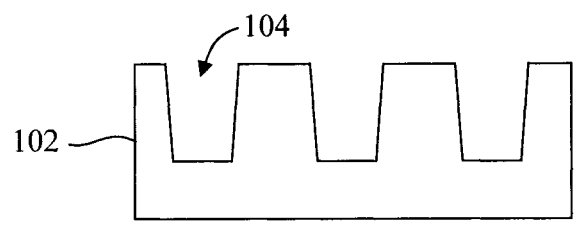
FIG. 1 is a cross-sectional diagram illustrating trenches having been patterned in a (first) dielectric according to an embodiment of the present invention.

Provided herein are air-gap-containing metal interconnects and techniques for formation thereof by a selectively-deposited dielectric material. As provided above, conventional air-gap technologies involve the use of "pinch off" methods to create air gaps between interconnect metal lines which can lead to unwanted materials being deposited onto the sidewalls of the metal lines. Namely, when forming air-gaps, a standard dielectric is typically deposited onto the metal lines. The deposited dielectric will accumulate and pinch off the opening between the metal lines enclosing an air-gap. Prior to the pinch-off, however, a significant amount of the dielectric will be deposited along the sidewalls of the metal lines. This material along the sidewalls of the metal lines undesirably increases the overall inter-metal capacitance, offsetting the capacitance benefits achieved by the air-gap.

Also, any misalignment that lands a contact via on top of an air gap can undesirably open up the air-gap. During subsequent metallization, metal and barrier/liner materials can find their way into the exposed air-gap, undesirably leading to electrical leakage and shorts.

Advantageously, the present techniques employ a selectively-deposited dielectric material as the pinch-off layer to close up the air-gaps. By "selectively-deposited" it is meant that the dielectric material will preferentially deposit at the opening of the space between the interconnect metal lines as opposed to along the interconnect metal line sidewalls. Thus, pinch off and air-gap formation is achieved with at most only a minimal amount of the dielectric material being deposited on the sidewalls of the interconnect metal lines, thereby minimizing the overall inter-metal capacitance.

The selectively-deposited dielectric material also provides etch selectivity over standard inter-layer dielectrics (ILDs) during via patterning. Thus, when an etch is performed to pattern vias in the ILD, and if misalignment should cause the via to land on top of an air gap, the selectively-deposited dielectric material will act as an etch stop preventing unwanted opening and exposure of the air-gap.

Suitable selectively-deposited dielectrics for use in accordance with the present techniques include, but are not limited to, poly(para-xylylene)-based polymers, i.e.,

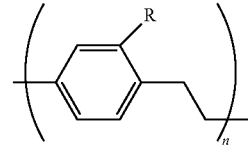

versions of which are commercially available under the name Parylene from Specialty Coating Systems, Indianapolis, Ind. See, for example, Vaeth et al., "Transition Metals for Selective Chemical Vapor Deposition of Parylene-Based Polymers," Chem. Mater., 2000, 12(5), pp. 1305-1313 (April, 2000) (hereinafter "Vaeth"), the contents of which are incorporated by reference as if fully set forth herein. A common form of Parylene has one chlorine group per repeating unit, i.e., R=Cl. This form is referred to as Parylene C. Other forms of Parylene can include two chlorine groups per repeating unit (Parylene D), an un-substituted molecule (Parylene N), etc.

Advantageously, poly(para-xylylene)-based polymers exhibit selective deposition on certain materials over others. For instance, poly(para-xylylene)-based polymers such as Parylene preferentially deposit on hardmask materials such as silicon carbide (SiC) and silicon nitride (SiN) as compared to metals such as tantalum (Ta), ruthenium (Ru), iron (Fe), cobalt (Co), nickel (Ni), platinum (Pt) and/or copper (Cu). As such, the latter can be used as 'inhibitors' to inhibit the deposition of the poly(para-xylylene)-based polymer on certain surfaces (such as along the sidewalls of the interconnect metal lines) as compared to 'non-inhibitor' surfaces (such as the hardmask at the opening of the air-gaps). That way, pinch off can be achieved with at most a minimal amount of the selectively-deposited dielectric being deposited on the sidewalls. Further, in some exemplary embodiments described in detail below, a (sacrificial) inhibitor layer will also be placed on top of the interconnect metal lines to inhibit deposition of the selectively-deposited dielectric on the interconnect metal lines. That way, during the subsequent via open stage, access to the interconnect metal lines is provided without risk of accidentally opening up the air-gaps which remain covered/protected by the selectively-deposited dielectric.

Further, the etch chemistry can be coordinated to provide selectivity for the poly(para-xylylene)-based polymers vis-à-vis the other interconnect materials, and vice versa. For instance, poly(para-xylylene)-based polymers such as Parylene can be selectively etched in oxygen ($O_2$) environments such as reactive ion beam (RIBE) and reactive ion etching (RIE) in oxygen environments. See, for example, Meng et al., "Parylene Etching Techniques for Microfluidics and Biomems," $18^{th}$ IEEE International Conference on Micro Electro Mechanical Systems, pp. 568-571, February 2005, the contents of which are incorporated by reference as if fully set forth herein. By comparison, capping materials such as silicon carbide (SiC) can be selectively etched using fluorine-based plasma chemistries such as sulfur tetrafluoride/argon ($SF_6$/Ar). See, for example, Pearton et al., "Dry Etching of Electronic Oxides, Polymers, and Semiconductors," Plasma Process. Polym. 2005, 2, pp. 16-37 (published December 2004), the contents of which are incorporated by reference as if fully set forth herein.

Poly(para-xylylene)-based polymers are only one of the selectively-deposited dielectrics contemplated herein for use in accordance with the present techniques. Other suitable selectively-deposited dielectrics include, but are not limited to, aluminum oxide ($AlO_x$). Area selective atomic layer deposition (ALD) can be used to deposit dielectrics such as $AlO_x$ on select surfaces using an inhibitor such as an organic blocking layer of, e.g., octadecylphosphonic acid (ODPA), on all but the select surfaces. See, for example, Hashemi et al., "Self-Correcting Process for High Quality Patterning by Atomic Layer Deposition," ASC Nano, vol. 9, no. 9 pp. 8710-8717 (July 2015) (hereinafter "Hashemi"), the contents of which are incorporated be reference as if fully set forth herein.

As above, the etch chemistry can be coordinated to provide selectivity for $AlO_x$ vis-à-vis the other interconnect materials, and vice versa. For instance, by way of example only, $AlO_x$ can be etched selective to silicon-containing material such as SiC using a boron-containing etchant. See, for example, U.S. Pat. No. 9,472,417 issued to Ingle et al., entitled "Plasma-Free Metal Etch" and U.S. Pat. No. 9,299,582 issued to Ingle et al., entitled "Selective Etch for Metal-Containing Materials," the contents of both of which are incorporated by reference as if fully set forth herein. By comparison, capping materials such as SiC can be selectively etched using chlorine ($Cl_2$)-based etchants. See, for example, Khan et al., "Etching of Silicon Carbide for Device Fabrication and through Via-Hole Formation," Journal of Electronic Materials, vol. 30, issue 3, pp. 212-219 (March 2001), the contents of which are incorporated by reference as if fully set forth herein. $AlO_x$ would not be etched in $Cl_2$. See, for example, U.S. Pat. No. 4,030,967 issued to Ingrey et al., entitled "Gaseous Plasma Etching of Aluminum and Aluminum Oxide," the contents of which are incorporated by reference as if fully set forth herein.

Given the above overview, an exemplary methodology for forming an air-gap containing metal interconnect structure by a selectively-deposited dielectric material is now described by way of reference to FIGS. 1-12. As shown in FIG. 1, the process begins with the patterning of trenches 104 in a dielectric 102. Suitable dielectrics 102 include, but are not limited to, oxide materials such as silicon oxide (SiOx) and/or organosilicate glass (SiCOH) and/or ultralow-κ interlayer dielectric (ULK-ILD) materials, e.g., having a dielectric constant κ of less than 2.7. By comparison, silicon dioxide ($SiO_2$) has a dielectric constant κ value of 3.9. Suitable ultralow-κ dielectric materials include, but are not limited to, porous organosilicate glass (pSiCOH).

Trenches 104 can be patterned in the dielectric 102 using standard lithography and etching techniques. A directional (anisotropic) etching process such as reactive ion etching (RIE) can be used for the trench etch. As will be described in detail below, the trenches 104 mark the location of interconnect metal lines that will be formed in the dielectric 102. It is between these metal lines that the air-gaps will be formed.

A conformal barrier layer 202 is then deposited into and lining the trenches 104, followed by a conformal liner 204 that is deposited onto the barrier layer 202. See FIG. 2. According to an exemplary embodiment, barrier layer 202 is formed from one (or more) of the above-mentioned inhibitor materials, i.e., materials that inhibit deposition of the selectively-deposited dielectric. Of course, the inhibitor material will depend on the particular selectively-deposited dielectric being employed. For instance, as provided above, suitable inhibitor materials for poly(para-xylylene)-based polymers include, but are not limited to, metals such as Ta, Ru, Fe, Co, Ni, Pt and/or Cu. For instance, according to one exemplary embodiment, the barrier layer 202 is formed from Ta and/or tantalum nitride (TaN). For dielectrics such as $AlO_x$, a barrier layer formed of these forgoing metal(s) can further be coated with (e.g., a monolayer) of an organic blocking material such as ODPA. As will be described in detail below, the dielectric 102 in between the trenches 104 will be removed to form the air-gaps. Doing so will expose the barrier layer 202 along the sidewalls of the interconnect metal lines. By placing an inhibitor material at this outermost exposed surface of the interconnect metal lines will help insure that at most minimal amounts of the selectively-deposited dielectric will be deposited on the sidewalls during pinch off.

Suitable materials for the liner 204 include, but are not limited to, metals such as Co and/or Ru. The barrier layer 202 and liner 204 can each be deposited using a conformal deposition process such as chemical vapor deposition (CVD), atomic layer deposition (ALD), or physical vapor deposition (PVD). According to an exemplary embodiment, the barrier layer 202 and liner 204 are each formed having a thickness of from about 1 nanometers (nm) to about 10 nm and ranges therebetween.

Figure 3:
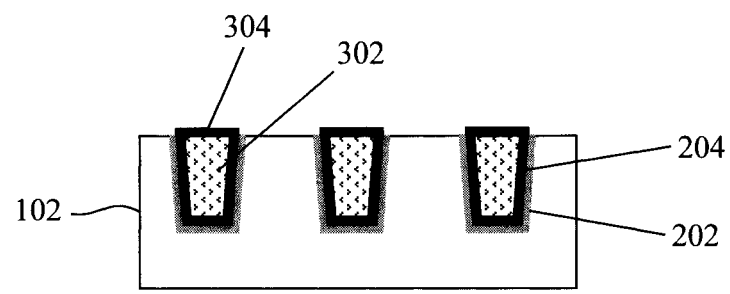
FIG. 3 is a cross-sectional diagram illustrating a fill metal having been deposited into and filling the trenches (over the barrier layer and liner) to form interconnect metal lines in the trenches embedded in the first dielectric, and a liner having been formed on top of each of the interconnect metal lines according to an embodiment of the present invention.
Figure 4:
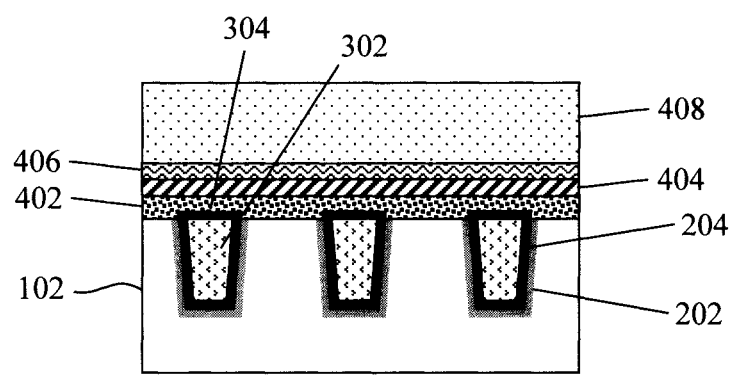
FIG. 4 is a cross-sectional diagram illustrating a capping layer having been deposited onto the first dielectric over the interconnect metal lines, an inhibitor layer having been deposited over the capping layer, and a lithographic stack (e.g., a hardmask and an organic planarizing layer (OPL)) having been formed on top of the inhibitor layer according to an embodiment of the present invention.

A fill metal is then deposited into and filling the trenches 104 (over the barrier layer 202 and liner 204) to form interconnect metal lines 302 in the trenches 104 embedded in the dielectric 102. See FIG. 3. As shown in FIG. 3, the barrier layer 202 and liner 204 separate the interconnect metal lines 302 from the dielectric 102. Suitable fill metals include, but are not limited to, Cu and/or Co. By way of example only, a thin (e.g., from about 1 nm to about 3 nm and ranges therebetween) seed layer of Cu and/or Co can first be deposited into/lining trenches 104 over the barrier layer 202 and liner 204 using a process such as CVD, ALD or PVD. According to an exemplary embodiment, the seed layer has the same composition as the bulk of the fill metal, and thus is not distinguishable as a separate layer in the figures. The bulk of the fill metal can then be plated over the seed layer.

The overburden of the fill metal is removed using a process such as chemical mechanical polishing (CMP), which also serves to remove the barrier layer 202 and liner 204 from the top surface of dielectric 102. See FIG. 3.

Liner 304 is then formed on top of each of the interconnect metal lines 302. According to an exemplary embodiment, liner 304 and liner 204 are formed from the same material (or combination of materials), e.g., Co and/or Ru. Like liner 204, according to an exemplary embodiment, liner 304 has a thickness of from about 1 nm to about 10 nm and ranges therebetween. According to an exemplary embodiment, the liner 304 is formed selectively on the interconnect metal lines 302. See, for example, U.S. Pat. No. 7,737,028 issued to Wang et al., entitled "Selective Ruthenium Deposition on Copper Materials," the contents of which are incorporated by reference as if fully set forth herein. Each of the interconnect metal lines 302 is now fully surrounded by a liner (i.e., liner 204/304) which improves interface scattering and resistance.

A capping layer 402 is next deposited onto the dielectric 102 over the interconnect metal lines 302. See FIG. 4. As will be described in detail below, capping layer 402 plays a role in the via open stage (i.e., when vias are formed in the next level dielectric over the interconnect metal lines 302). In that regard, the capping layer 402 is preferably formed from a material that can be etched selective to the selectively-deposited dielectric. For instance, suitable materials for the capping layer 402 include, but are not limited to, SiC and/or SiC-based materials such as NBLOk (SiC(N,H)) which is commercially available from Applied Materials, Santa Clara, Calif. As provided above, materials such as SiC can be etched selective to the selectively-deposited dielectric based on the etch chemistries employed. For instance, poly(para-xylylene)-based polymers such as Parylene can be selectively etched in $O_2$ environments such as RIBE and RIE in oxygen environments, whereas SiC can be selectively etched using fluorine-based plasma chemistries such as $SF_6$/Ar. Alternatively, $AlO_x$ can be selectively etched using a boron-containing etchant, whereas SiC can be selectively etched using $Cl_2$-based etchants. This etch selectivity will enable the selectively-deposited dielectric to remain intact over the air-gaps during the via open stage to avoid opening up the air-gaps (see above).

By way of example only, capping layer 402 can be deposited using a CVD process such as plasma-enhanced CVD (PECVD). According to an exemplary embodiment, the capping layer 402 is formed having a thickness of from about 5 nm to about 30 nm and ranges therebetween.

In this particular example, an inhibitor layer 404 is employed over the capping layer 402. As provided above, an inhibitor can be used to inhibit deposition of the selectively-deposited dielectric at certain locations. Namely, the goal here will be to use the selectively-deposited dielectric to pinch off the air-gaps between the interconnect metal lines 302. It is, however, desirable to provide access to the interconnect metal lines during the via open stage without risking accidentally opening up the air-gaps. The inhibitor layer 404 serves to place the selectively-deposited dielectric over/protecting the air-gaps while leaving the area over the interconnect metal lines 302 free of the dielectric.

The inhibitor layer 404 is a sacrificial material. By 'sacrificial' it is mean that inhibitor layer 404 will be used for the placement of the selectively-deposited dielectric, and then is removed. Of course, the inhibitor material for inhibitor layer 404 will depend on the particular selectively-deposited dielectric being employed. For instance, as provided above, suitable inhibitor materials for poly(para-xylylene)-based polymers include, but are not limited to, metals such as Ta, Ru, Fe, Co, Ni, Pt and/or Cu. For dielectrics such as $AlO_x$, an inhibitor layer formed of these forgoing metal(s) can further be coated with (e.g., a monolayer) of an organic blocking material such as ODPA. Inhibitor layer 404 can be deposited using a process such as CVD, ALD, PVD, evaporation, sputtering, plating, etc. According to an exemplary embodiment, inhibitor layer 404 is formed having a thickness of from about 5 nm to about 20 nm and ranges therebetween.

A lithographic stack is then formed on top of the inhibitor layer 404 over the dielectric 102/interconnect metal lines 302. According to an exemplary embodiment, the lithographic stack includes a hardmask 406 disposed on the inhibitor layer 404 and an organic planarizing layer (OPL) 408 disposed on the hardmask 406. Suitable materials for hardmask 406 include, but are not limited to, nitride hardmask materials such as silicon nitride (SiN). The hardmask 406 can be deposited using a CVD process such as PECVD or low-pressure CVD (LPCVD). According to an exemplary embodiment, the hardmask 406 is formed having a thickness of from about 10 nm to about 20 nm and ranges therebetween.

Suitable materials for OPL 408 include, but are not limited to, aromatic cross-linkable polymers (e.g., naphthalene-based) in a solvent. Other suitable materials for OPL 408 include, but are not limited to, those described in U.S. Pat. No. 7,037,994 issued to Sugita et al. entitled "Acenaphthylene Derivative, Polymer, and Antireflection Film-Forming Composition" (hereinafter "U.S. Pat. No. 7,037,994"), U.S. Pat. No. 7,244,549 issued to Iwasawa et al. entitled "Pattern Forming Method and Bilayer Film" (hereinafter "U.S. Pat. No. 7,244,549"), U.S. Pat. No. 7,303,855 issued to Hatakeyama et al. entitled "Photoresist Undercoat-Forming Material and Patterning Process" (hereinafter "U.S. Pat. No. 7,303,855") and U.S. Pat. No. 7,358,025 issued to Hatakeyama entitled "Photoresist Undercoat-Forming Material and Patterning Process" (hereinafter "U.S. Pat. No. 7,358,025") the contents of each of which are incorporated by reference as if fully set forth herein.

The OPL 408 can be deposited onto the hardmask 406 using a casting process such as spin-coating. According to an exemplary embodiment, the OPL 408 is formed having a thickness of from about 50 nm to about 400 nm and ranges therebetween.

Figure 5:
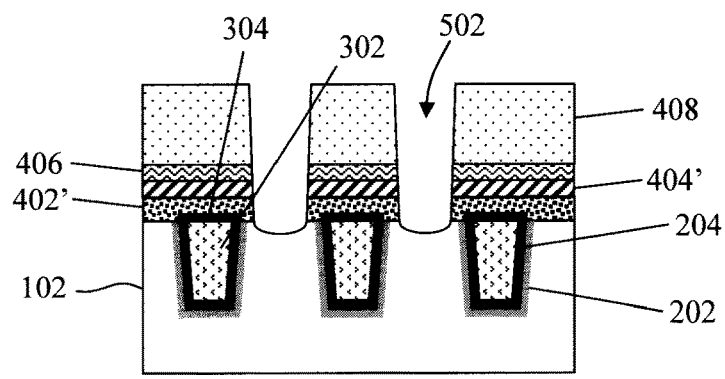
FIG. 5 is a cross-sectional diagram illustrating trenches having been patterned in the lithographic stack in between the interconnect metal lines according to an embodiment of the present invention.

Standard lithography and etching techniques are then employed to pattern trenches 502 in the lithographic stack. See FIG. 5. While not shown in FIG. 5, patterning of the lithographic stack can involve placing an antireflective coating (ARC) and photoresist on top of the OPL 408. See, for example, U.S. Pat. No. 8,986,921 issued to Edelstein et al., entitled "Lithographic Material Stack Including a Metal-Compound Hard Mask," the contents of which are incorporated by reference as if fully set forth herein. The photoresist is developed, and the pattern therefrom is transferred to the hardmask 406/OPL 408. As shown in FIG. 5, the trenches 502 extend through the capping layer 402/inhibitor layer 404, exposing the dielectric 102 in between the interconnect metal lines 302. A directional (anisotropic) etching process such as RIE can be used for the trench etch.

Notably, trenches 502 are located in between the interconnect metal lines 302. Thus, following patterning of the capping layer 402/inhibitor layer 404, portions of these layers (now given the reference numerals 402' and 404', respectively) remain over only the interconnect metal lines. This configuration will impact placing the selectively-deposited dielectric over the air-gaps (see below).

Figure 6:
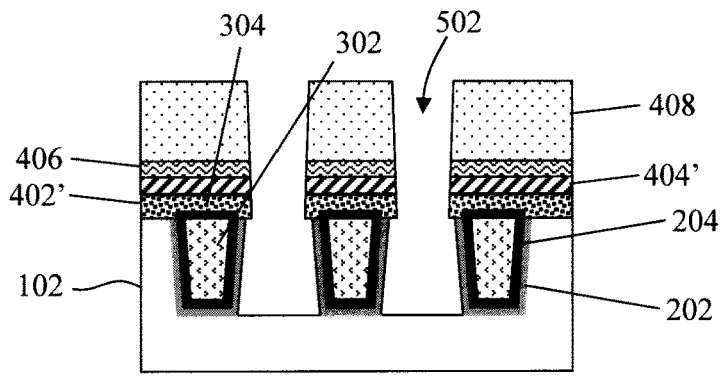
FIG. 6 is a cross-sectional diagram illustrating the trenches having been extended into the first dielectric forming air-gaps between the interconnect metal lines according to an embodiment of the present invention.
Figure 7:
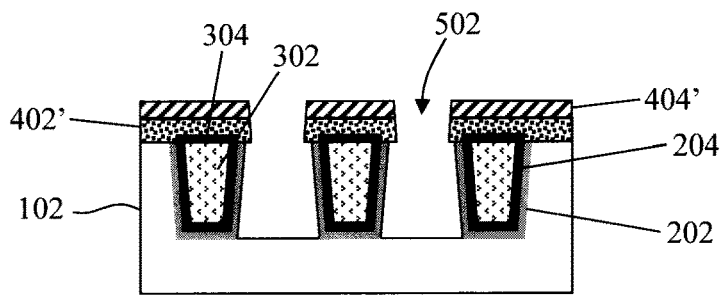
FIG. 7 is a cross-sectional diagram illustrating the hardmask and OPL having been removed according to an embodiment of the present invention.

The trenches 502 are then extended into the dielectric 102. See FIG. 6. As shown in FIG. 6, the trenches 502 now extend partway through the dielectric. The goal is to fully remove the dielectric 102 from in between the interconnect metal lines 302 to form air-gaps between the interconnect metal lines 302. Thus, a non-directional (isotropic) etching process such as a wet chemical etch can be employed to fully clear the dielectric 102 from alongside interconnect metal lines 302.

Trenches 502 in the dielectric 102 will be pinched off using the selectively-deposited dielectric (as described below). As shown in FIG. 6, the barrier layer 202 present along the sidewalls of the interconnect metal lines 302 is now exposed in the trenches 502. This is notable since, as provided above, the barrier layer 202 is preferably formed from an inhibitor material. Thus, if any of the selectively-deposited dielectric ends up on the barrier layer 202 during the pinch off process the amount will be minimal, therefore the build-up of unwanted dielectric on the sidewalls of the interconnect metal lines 302 can be largely avoided.

The hardmask 406 and OPL 408 are then removed. See FIG. 7. Doing so exposes the inhibitor layer 404 which will serve to prevent deposition of the selectively-deposited dielectric on top of the interconnect metal lines 302. Namely, as shown in FIG. 8, a (second) dielectric 802 (i.e., the selectively-deposited dielectric) is deposited into the trenches 502 using a process such as CVD (see, for example, Vaeth) and/or area-selective ALD (see, for example, Hashemi).

Figure 8:
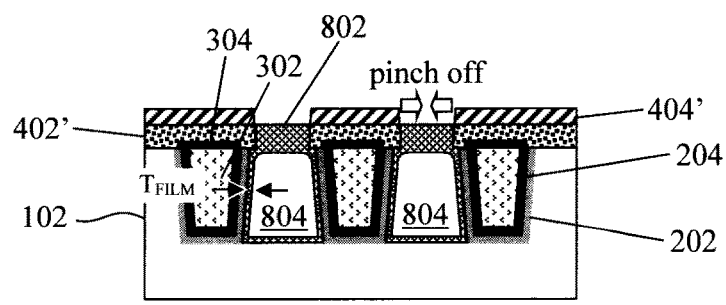
FIG. 8 is a cross-sectional diagram illustrating a (second) dielectric having been selectively deposited into the trenches forming a bridge of the selectively-deposited dielectric material over and pinching off the air-gaps according to an embodiment of the present invention.
Figure 9:
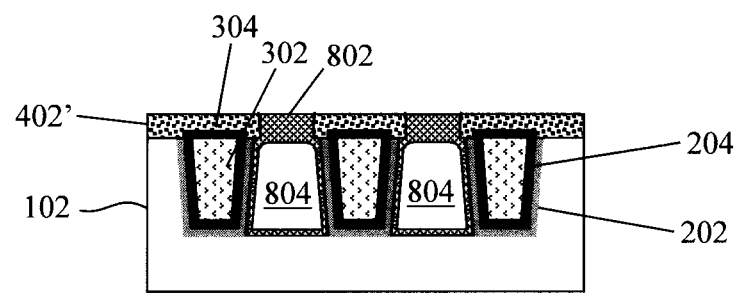
FIG. 9 is a cross-sectional diagram illustrating the inhibitor layer having been removed according to an embodiment of the present invention.
Figure 10:
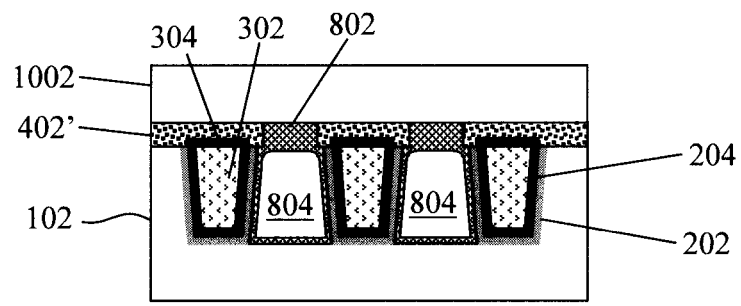
FIG. 10 is a cross-sectional diagram illustrating a (third) dielectric having been deposited on the first dielectric over the interconnect metal lines and air gaps according to an embodiment of the present invention.

As shown in FIG. 8, dielectric 802 selectively deposits on the surfaces of 'non-inhibitor' materials such as the capping layer 402' (e.g., SiC) as opposed to on the surfaces of 'inhibitor' materials such as the barrier layer 202 and inhibitor layer 404'. The top surface of the capping layer 402' is covered by the inhibitor layer 404. Thus, deposition of the dielectric 802 occurs on the exposed side surfaces of the capping layer 402' over the openings to air-gaps 804 in dielectric 102, forming a bridge of the dielectric 802 material over and pinching off the air-gaps 804.

Based on the inhibitor-effect of the material(s) used for the barrier layer 202, at most only a small film of the dielectric 802 deposits along the sidewalls of the interconnect metal lines 302 within the air-gaps 804. For instance, the film has thickness $T_{FILM}$ of less than 1 nm. See FIG. 8.

The inhibitor layer 404', i.e., a sacrificial layer, is then removed using, e.g., a directional (anisotropic) dry etching process. See FIG. 9. A (third) dielectric 1002 is then deposited on the (first) dielectric 102 over the interconnect metal lines 302 and air gaps 804. See FIG. 10. As provided above, suitable dielectrics include, but are not limited to, oxide materials such as SiOx and/or SiCOH and/or ULK-ILD materials, e.g., pSiCOH.

Standard lithography and etching techniques are then employed to pattern vias 1102 in the dielectric 1002. See FIG. 11. A directional (anisotropic) etching process such as RIE can be employed for the via etch. This stage was referred to above as the via open stage. For illustrative purposes only, vias 1102 are formed over the left and center interconnect metal lines and absent over the right interconnect metal line 302 in the figures.

Figure 11:
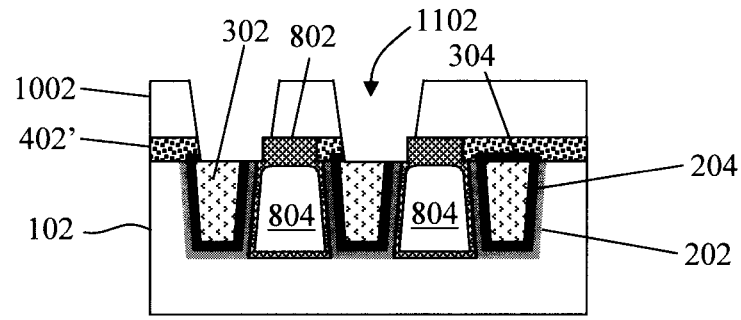
FIG. 11 is a cross-sectional diagram illustrating vias having been patterned in the third dielectric according to an embodiment of the present invention.
Figure 12:
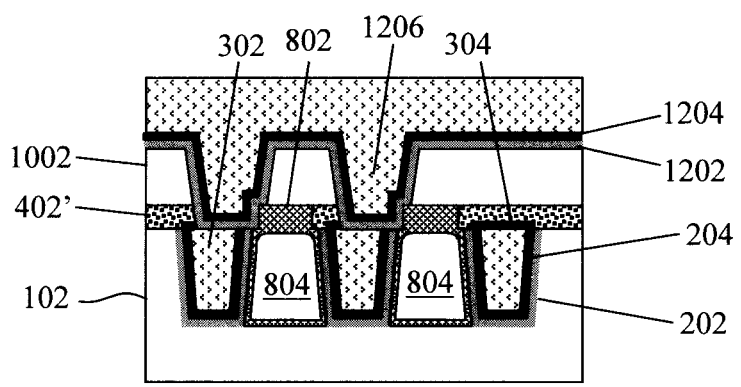
FIG. 12 is a cross-sectional diagram illustrating a conformal barrier layer having been deposited into and lining the vias, and a conformal liner having been deposited onto the barrier layer, and a fill metal having been deposited into and filling the vias to form contacts in the vias embedded in the dielectric according to an embodiment of the present invention.

As shown in FIG. 11, the vias 1102 extend through the dielectric 1002, the capping layer 402', and liner 304 down to the interconnect metal lines 302. Notably, the via etch through the capping layer 402' is performed using an etch chemistry that is selective for etching the capping layer 402' as opposed to the dielectric 802. For instance, as provided above, capping materials such as SiC can be etched selective to the dielectric 802 using fluorine-based plasma chemistries such as $SF_6$/Ar. That way, as shown in FIG. 11, even if the vias 1102 are slightly misaligned (i.e., the vias 1102 do not land squarely on the underlying interconnect metal lines 302), the via etch will not remove the dielectric 802 over the air-gaps 804. Thus, the air-gaps 804 will remain covered/protected and will not run the risk of receiving any metal during subsequent metallization of the vias.

A conformal barrier layer 1202 is then deposited into and lining the vias 1102, followed by a conformal liner 1204 that is deposited onto the barrier layer 1202. See FIG. 12. As provided above, suitable materials for the barrier layer 1202 include, but are not limited to, metals such as Ta, Ru, Fe, Co, Ni, Pt and/or Cu. For dielectrics such as $AlO_x$, a barrier layer formed of these forgoing metal(s) can further be coated with (e.g., a monolayer) of an organic blocking material such as ODPA. Suitable materials for the liner 1204 include, but are not limited to, metals such as Co and/or Ru. The barrier layer 1202 and liner 1204 can each be deposited using a conformal deposition process such as CVD, ALD, or PVD. According to an exemplary embodiment, the barrier layer 1202 and liner 1204 are each formed having a thickness of from about 1 nm to about 10 nm and ranges therebetween.

A fill metal is then deposited into and filling the vias 1102 (over the barrier layer 1202 and liner 1204) to form contacts 1206 in the vias 1102 embedded in the dielectric 1002. Suitable fill metals include, but are not limited to, Cu and/or Co. By way of example only, a thin (e.g., from about 1 nm to about 3 nm and ranges therebetween) seed layer of Cu and/or Co (not shown) can first be deposited into/lining the vias 1102 over the barrier layer 1202 and liner 1204. The bulk of the fill metal can then be plated over the seed layer.

While the use of an 'inhibitor' layer above the interconnect metal lines (as just described) beneficially limits the selectively-deposited dielectric to the region of the air-gaps, embodiments are also contemplated herein wherein a simplified process flow is employed without an 'inhibitor' layer. In this alternative embodiment, use of the selectively-deposited dielectric minimizes material build-up on the sidewalls of the interconnect metal lines, thereby providing an advantage over conventional air-gap technologies. This alternative methodology for forming an air-gap containing metal interconnect structure is now described by way of reference to FIGS. 13-18.

Figure 2:
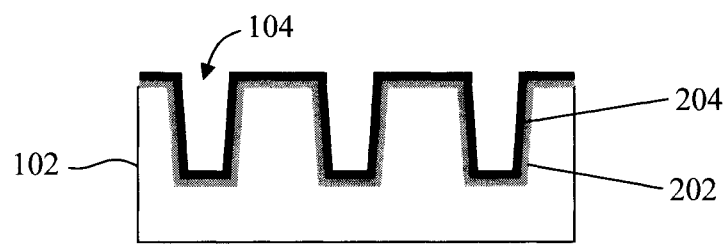
FIG. 2 is a cross-sectional diagram illustrating a conformal barrier layer having been deposited into and lining the trenches, and a conformal liner having been deposited onto the barrier layer according to an embodiment of the present invention.
Figure 13:
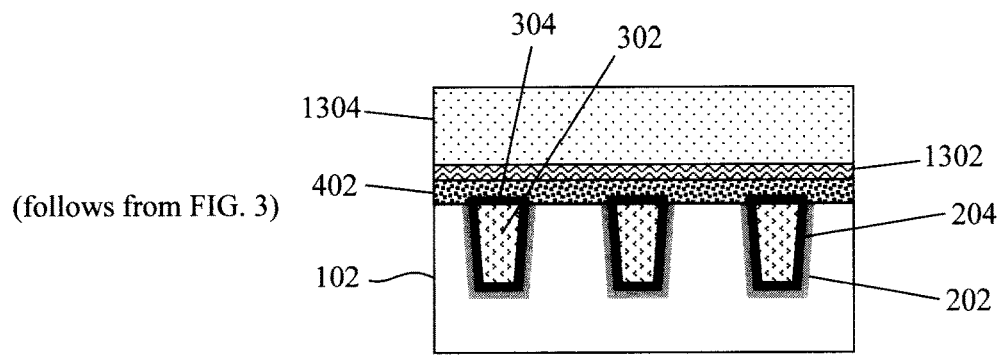
FIG. 13 is a cross-sectional diagram, which follows from FIG. 3, illustrating according to an alternative embodiment a capping layer having been deposited onto the first dielectric over the interconnect metal lines, and a lithographic stack (e.g., hardmask and OPL) having been formed directly on the capping layer according to an embodiment of the present invention.

This alternative methodology begins in the same manner as described in accordance with the description of FIGS. 1-3 above, with the patterning of trenches 104 in the dielectric 102 (e.g., oxide materials such as SiOx and/or SiCOH and/or ULK-ILD materials such as pSiCOH), deposition of a conformal barrier layer 202 (e.g., metals such as Ta, Ru, Fe, Co, Ni, Pt and/or Cu, optionally coated with, e.g., a monolayer of an organic blocking material such as ODPA) into and lining the trenches 104, deposition of a conformal liner 204 (e.g., Co and/or Ru), deposition of a fill metal (e.g., Cu and/or Co) to form the interconnect metal lines 302 in the trenches 104, and formation of a liner 304 (e.g., Co and/or Ru) on top of each of the interconnect metal lines 302. Accordingly, what is shown in FIG. 13 follows from FIG. 3, and like structures are numbered alike in the drawings.

As above, capping layer 402 (e.g., SiC and/or (SiC(N,H)) is next deposited onto the dielectric 102 over the interconnect metal lines 302. In this example, however, the lithographic stack is formed directly on the capping layer 402 over the dielectric 102/interconnect metal lines 302 (without an intervening inhibitor layer). See FIG. 13.

According to an exemplary embodiment, the lithographic stack includes a hardmask 1302 disposed on the capping layer 402 and an OPL 1304 disposed on the hardmask 1302. As provided above, suitable materials for hardmask 1302 include, but are not limited to, nitride hardmask materials such as SiN which can be deposited using a CVD process such as PECVD or LPCVD. According to an exemplary embodiment, hardmask 1302 is formed having a thickness of from about 10 nm to about 20 nm and ranges therebetween.

As provided above, suitable materials for OPL 1304 include, but are not limited to, aromatic cross-linkable polymers (e.g., naphthalene-based) in a solvent. See also, U.S. Pat. Nos. 7,037,994, 7,244,549, 7,303,855 and 7,358, 025 for other suitable OPL materials. The OPL 1304 can be deposited onto the hardmask 1302 using a casting process such as spin-coating. According to an exemplary embodiment, the OPL 1304 is formed having a thickness of from about 50 nm to about 400 nm and ranges therebetween.

Figure 14:
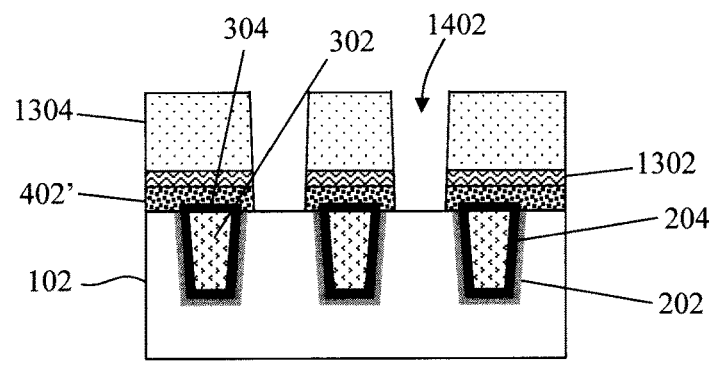
FIG. 14 is a cross-sectional diagram illustrating trenches having been patterned in the lithographic stack and the capping layer according to an embodiment of the present invention.

In the same manner as described above, standard lithography and etching techniques are then used to pattern trenches 1402 in the lithographic stack and the capping layer (which is now given the reference numeral 402'). See FIG. 14. As shown in FIG. 14, the dielectric 102 in between the interconnect metal lines 302 is exposed at the bottom of the trenches 1402.

Figure 15:
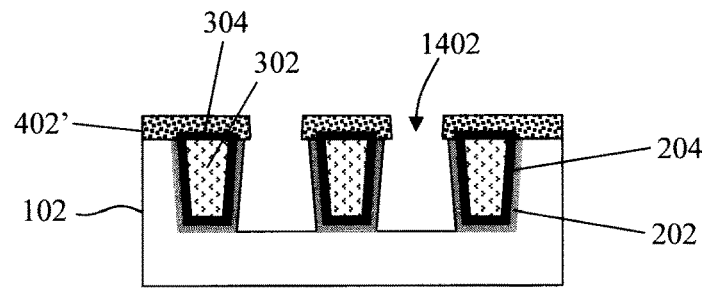
FIG. 15 is a cross-sectional diagram illustrating the trenches having been extended into the first dielectric, and the lithographic stack having been removed according to an embodiment of the present invention.

The trenches 1402 are then extended into the dielectric 102, after which the lithographic stack is removed. See FIG. 15. As shown in FIG. 15, the trenches 1402 now extend partway through the dielectric 102. As above, the goal is to fully remove the dielectric 102 from in between the interconnect metal lines 302 forming air-gaps between the interconnect metal lines 302. Thus, a non-directional (isotropic) etching process such as a wet chemical etch can be employed to fully clear the dielectric 102 from alongside interconnect metal lines 302.

Trenches 1402 in the dielectric 102 will be pinched off using the selectively-deposited dielectric (as described below). As shown in FIG. 15, the barrier layer 202 present along the sidewalls of the interconnect metal lines 302 is now exposed in the trenches 1402. This is notable since, as provided above, the barrier layer 202 is preferably formed from an inhibitor material. Thus, if any of the selectively-deposited dielectric material ends up on the barrier layer 202 during the pinch off process the amount will be minimal, therefore unwanted material build-up on the sidewalls of the interconnect metal lines 302 can be largely avoided.

Figure 16:
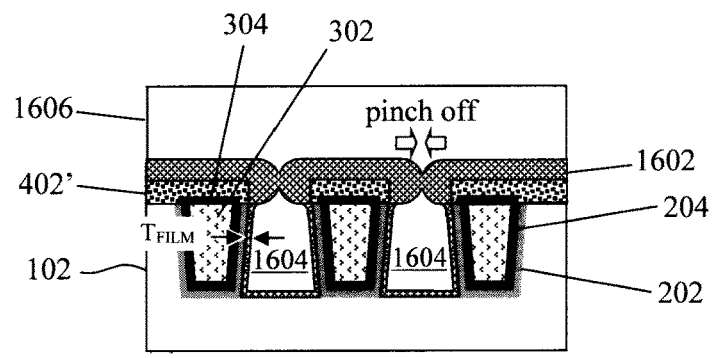
FIG. 16 is a cross-sectional diagram illustrating a (second) dielectric material having been selectively deposited into the trenches forming a bridge of the selectively-deposited dielectric material over and pinching off the air-gaps, and a (third) dielectric having been deposited on the (first) dielectric over the interconnect metal lines and air-gaps according to an embodiment of the present invention.

As shown in FIG. 16, a (second) dielectric 1602 (i.e., the selectively-deposited dielectric) is next deposited into the trenches 1402 using a process such as CVD (see, for example, Vaeth) and/or area-selective ALD (see, for example, Hashemi). As shown in FIG. 16, only a minimal amount of the dielectric 1602 deposits onto the surfaces of 'inhibitor' materials such as the barrier layer 202 along the sidewalls of the interconnect metal lines 302 in the air-gaps. For instance, based on the inhibitor-effect of the material(s) used for the barrier layer 202, at most only a small film of the dielectric 1602 deposits along the sidewalls of the metal lines 302. For instance, the film has thickness $T_{FILM}$ of less than 1 nm. See FIG. 16.

Deposition of the dielectric 1602 occurs on the sides of the capping layer 402' over the openings to air-gaps 1604 in dielectric 102, forming a bridge of the dielectric 1602 material over and pinching off the air-gaps 1604 (with minimal, if any, build up along the sidewalls of the interconnect metal lines 302—see above). Since an inhibitor layer over the interconnect metal lines 302 is not present in this example, the dielectric 1602 will also deposit on top of the capping layer 402' as shown in FIG. 16. However, as long as care is taken to align the vias with the interconnect metal lines during the via open stage, the air-gaps 1604 will remain protected by the dielectric 1602.

A (third) dielectric 1606 is then deposited on the (first) dielectric 102/(second) dielectric 1602 over the interconnect metal lines 302 and air-gaps 1604. As provided above, suitable dielectrics include, but are not limited to, oxide materials such as SiOx and/or SiCOH and/or ULK-ILD materials, e.g., pSiCOH.

Figure 17:
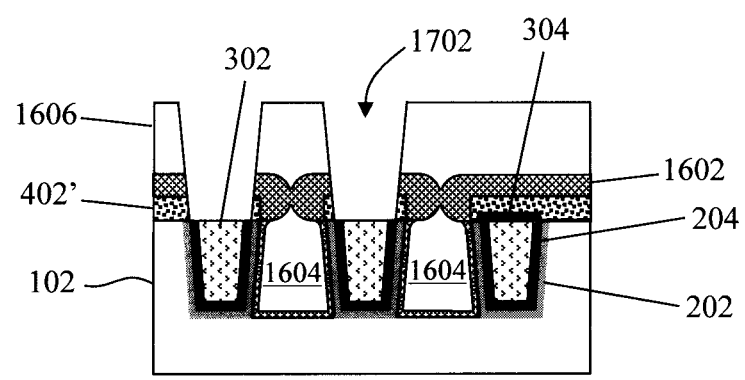
FIG. 17 is a cross-sectional diagram illustrating vias having been patterned in the third dielectric according to an embodiment of the present invention.
Figure 18:
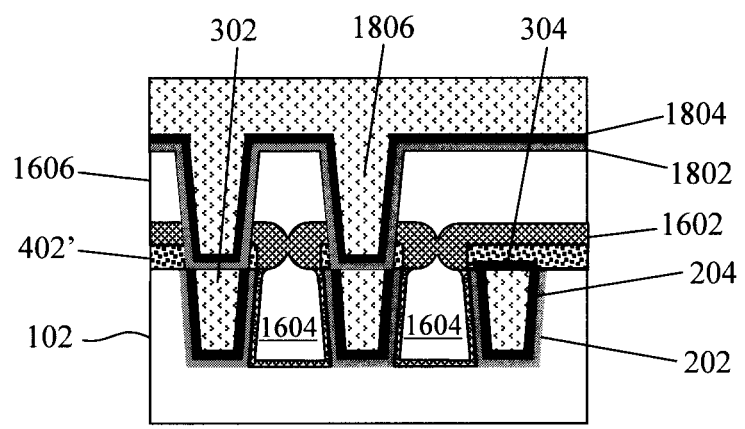
FIG. 18 is a cross-sectional diagram illustrating a conformal barrier layer having been deposited into and lining the vias, a conformal liner having been deposited onto the barrier layer, and a fill metal having been deposited into and filling the vias to form contacts in the vias embedded in the dielectric according to an embodiment of the present invention.

Standard lithography and etching techniques are then employed to pattern vias 1702 in the dielectric 1606. See FIG. 17. A directional (anisotropic) etching process such as RIE can be employed for the via etch. This is the stage referred to herein as the via open stage. For illustrative purposes only, vias 1702 are formed over the left and center interconnect metal lines and absent over the right interconnect metal line 302 in the figures. In this case, care is taken to align the vias 1702 over the interconnect metal lines 302 in order to prevent accidentally opening up any of the air-gaps 1604. As shown in FIG. 17, vias 1702 extend through the dielectric 1606, the dielectric 1602, the capping layer 402', and liner 304 down to the interconnect metal lines 302.

A conformal barrier layer 1802 is then deposited into and lining the vias 1702, followed by a conformal liner 1804 that is deposited onto the barrier layer 1802. See FIG. 18. As provided above, suitable materials for the barrier layer 1802 include, but are not limited to, metals such as Ta, Ru, Fe, Co, Ni, Pt and/or Cu, optionally coated with, e.g., a monolayer, of an organic blocking material such as ODPA. Suitable materials for the liner 1804 include, but are not limited to, metals such as Co and/or Ru. The barrier layer 1802 and liner 1804 can each be deposited using a conformal deposition process such as CVD, ALD, or PVD. According to an exemplary embodiment, the barrier layer 1802 and liner 1804 are each formed having a thickness of from about 1 nm to about 10 nm and ranges therebetween.

A fill metal 1806 is then deposited into and filling the vias 1702 (over the barrier layer 1802 and liner 1804) to form contacts 1806 in the vias 1702 embedded in the dielectric 1606. Suitable fill metals 1806 include, but are not limited to, Cu and/or Co. By way of example only, a thin (e.g., from about 1 nm to about 3 nm and ranges therebetween) seed layer of Cu and/or Co (not shown) can first be deposited into/lining the vias 1702 over the barrier layer 1802 and liner 1804. The bulk of the fill metal can then be plated over the seed layer.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an interconnect structure with air-gaps, the method comprising the steps of:
   forming interconnect metal lines embedded in a first dielectric with the interconnect metal lines separated from the first dielectric by a liner and a barrier layer;
   depositing a capping layer onto the first dielectric over the interconnect metal lines;
   depositing an inhibitor layer over the capping layer;
   patterning the capping layer, the inhibitor layer and the first dielectric, wherein the patterning comprises removing the first dielectric from between the interconnect metal lines to form the air-gaps between the interconnect metal lines and exposing the barrier layer along sidewalls of the interconnect metal lines;
   selectively depositing a second dielectric onto exposed surfaces of the capping layer at openings to the air-gaps to form a bridge of the second dielectric over and pinching off the air-gaps, wherein the barrier layer inhibits deposition of the second dielectric along the sidewalls of the interconnect metal lines, and wherein the inhibitor layer inhibits deposition of the second dielectric on top of the interconnect metal lines; and removing the inhibitor layer.

2. The method of claim 1, further comprising the steps of:

depositing a third dielectric over the interconnect metal lines and the air-gaps;

patterning vias in the third dielectric aligned with one or more of the interconnect metal lines; and forming contacts in the vias.

3. The method of claim 2, wherein the vias are patterned in the third dielectric using an etch that is selective for etching the capping layer over the second dielectric, such that the second dielectric remains over and protecting the air-gaps during the patterning.

4. The method of claim 1, wherein the second dielectric comprises a poly(para-xylylene)-based polymer.

5. The method of claim 4, wherein the barrier layer and the inhibitor layer each comprises a metal selected from the group consisting of: tantalum (Ta), ruthenium (Ru), iron (Fe), cobalt (Co), nickel (Ni), platinum (Pt), copper (Cu), and combinations thereof.

6. The method of claim 1, wherein the liner comprises a metal selected from the group consisting of Co, Ru, and combinations thereof.

7. The method of claim 1, wherein the interconnect metal lines each comprises a metal selected from the group consisting of Cu, Co, and combinations thereof.

8. The method of claim 1, wherein the capping layer comprises a material selected from the group consisting of: silicon carbide (SiC), SiC(N,H), and combinations thereof.

\* \* \* \* \*